(12) United States Patent
Matsushita et al.

(10) Patent No.: US 7,789,965 B2
(45) Date of Patent: Sep. 7, 2010

(54) METHOD OF CLEANING UV IRRADIATION CHAMBER

(75) Inventors: Kiyohiro Matsushita, Tama (JP); Hideaki Fukuda, Tama (JP); Kenichi Kagami, Tama (JP)

(73) Assignee: ASM Japan K.K., Toyko (JP)

( * ) Notice: Subject to any disclaimer, the term of this patent is extended or adjusted under 35 U.S.C. 154(b) by 320 days.

(21) Appl. No.: 11/857,639

(22) Filed: Sep. 19, 2007

(65) Prior Publication Data
US 2008/0066778 A1   Mar. 20, 2008

Related U.S. Application Data (60) Provisional application No. 60/845,732, filed on Sep. 19, 2006.

(51) Int. Cl.
*B08B 7/04* (2006.01)

(52) U.S. Cl. .............................. 134/1; 134/1.1; 134/1.2; 134/1.3; 134/19; 134/22.1; 134/26; 134/30; 134/37; 134/42; 134/902

(58) Field of Classification Search ...................... 134/1, 134/1.1, 1.2, 1.3, 19, 22.1, 26, 30, 37, 42, 134/902
See application file for complete search history.

(56) References Cited

U.S. PATENT DOCUMENTS

| | | | |
|---|---|---|---|
| 3,375,145 A | 3/1968 | Bernard et al. |
| 3,623,712 A | 11/1971 | McNeilly et al. |
| 3,865,072 A | 2/1975 | Kirkman |
| 4,047,496 A | 9/1977 | McNeilly |
| 4,115,163 A | 9/1978 | Gorina et al. |
| 4,210,925 A | 7/1980 | Morcom et al. |
| 4,358,686 A | 11/1982 | Kinoshita |
| 4,361,461 A | 11/1982 | Chang |
| 4,517,223 A | 5/1985 | Ovshinsky et al. |
| 4,539,933 A | 9/1985 | Campbell et al. |
| 4,615,905 A | 10/1986 | Ovshinsky et al. |
| 4,632,057 A | 12/1986 | Price et al. |

(Continued)

FOREIGN PATENT DOCUMENTS

EP    0100079 A2    2/1984

(Continued)

OTHER PUBLICATIONS

Wolansky et al., "Low temperature clean for Si/SiGe epitaxy for CMOS integration of heterojunction bipolar transistors," Proceedings of the 8th International Symposium on Silicon Materials Science and Technology, vol. 1, pp. 812-821 (1989).

(Continued)

*Primary Examiner*—Sharidan Carrillo
(74) *Attorney, Agent, or Firm*—Knobbe, Martens, Olson, & Bear LLP (57) ABSTRACT

A method of cleaning a UV irradiation chamber includes steps of: (i) after completion of irradiating a substrate with UV light transmitted through an optical transmitted window provided in the UV irradiation chamber, generating radical species of a cleaning gas outside the UV irradiation chamber; and (ii) introducing the radical species from the outside of the UV irradiation chamber into the UV irradiation chamber, thereby cleaning the optical transmitted window.

7 Claims, 6 Drawing Sheets

U.S. PATENT DOCUMENTS

| | | | |
|---|---|---|---|
| 4,692,343 A | 9/1987 | Price | |
| 4,699,689 A | 10/1987 | Bersin | |
| 4,749,440 A | 6/1988 | Blackwood et al. | |
| 4,820,377 A | 4/1989 | Davis et al. | |
| 4,870,030 A | 9/1989 | Markunas et al. | |
| 4,877,757 A | 10/1989 | York et al. | |
| 4,904,621 A | 2/1990 | Loewenstein et al. | |
| 4,913,929 A | 4/1990 | Moslehi et al. | |
| 4,940,505 A | 7/1990 | Schachameyer et al. | |
| 5,011,789 A | 4/1991 | Burns | |
| 5,028,973 A | 7/1991 | Bajor | |
| 5,120,394 A | 6/1992 | Mukai | |
| 5,129,958 A | 7/1992 | Nagashima et al. | |
| 5,138,973 A | 8/1992 | Davis et al. | |
| 5,144,376 A | 9/1992 | Kweon | |
| 5,156,820 A | 10/1992 | Wong et al. | |
| 5,158,644 A | 10/1992 | Cheung et al. | |
| 5,198,634 A | 3/1993 | Mattson et al. | |
| 5,211,796 A | 5/1993 | Hansen | |
| 5,217,559 A | 6/1993 | Moslehi et al. | |
| 5,228,206 A | 7/1993 | Grant et al. | |
| 5,246,885 A | 9/1993 | Braren et al. | |
| 5,248,636 A | 9/1993 | Davis et al. | |
| 5,252,841 A | 10/1993 | Wen et al. | |
| 5,262,354 A | 11/1993 | Cote et al. | |
| 5,275,687 A | 1/1994 | Choquette et al. | |
| 5,285,089 A | 2/1994 | Das | |
| 5,306,671 A | 4/1994 | Ogawa et al. | |
| 5,319,220 A | 6/1994 | Suzuki et al. | |
| 5,323,032 A | 6/1994 | Sato et al. | |
| 5,326,992 A | 7/1994 | Yoder | |
| 5,373,806 A | 12/1994 | Logar | |
| 5,378,901 A | 1/1995 | Nii | |
| 5,380,370 A | 1/1995 | Niino et al. | |
| 5,403,434 A | 4/1995 | Moslehi | |
| 5,421,957 A | 6/1995 | Carlson et al. | |
| 5,422,502 A | 6/1995 | Kovacic | |
| 5,425,842 A | 6/1995 | Zijlstra | |
| 5,470,799 A | 11/1995 | Itoh et al. | |
| 5,496,745 A | 3/1996 | Ryum et al. | |
| 5,508,536 A | 4/1996 | Twynam et al. | |
| 5,512,772 A | 4/1996 | Maeda et al. | |
| 5,517,943 A | 5/1996 | Takahashi | |
| 5,521,108 A | 5/1996 | Rostoker et al. | |
| 5,557,117 A | 9/1996 | Matsuoka et al. | |
| 5,557,118 A | 9/1996 | Hashimoto | |
| 5,609,721 A | 3/1997 | Tsukune et al. | |
| 5,620,559 A | 4/1997 | Kikuchi | |
| 5,670,801 A | 9/1997 | Nakano | |
| 5,686,748 A | 11/1997 | Thakur et al. | |
| 5,693,147 A | 12/1997 | Ward et al. | |
| 5,698,039 A | 12/1997 | Patz et al. | |
| 5,729,033 A | 3/1998 | Hafizi | |
| 5,759,281 A | 6/1998 | Gurary et al. | |
| 5,773,100 A * | 6/1998 | Chang et al. ................ 427/579 |
| 5,783,495 A | 7/1998 | Li et al. | |
| 5,788,778 A | 8/1998 | Shang et al. | |
| 5,859,447 A | 1/1999 | Yang et al. | |
| 5,871,853 A | 2/1999 | Azuma et al. | |
| 5,899,752 A | 5/1999 | Hey et al. | |
| 5,923,966 A | 7/1999 | Teramoto et al. | |
| 5,926,743 A | 7/1999 | Xi et al. | |
| 5,986,287 A | 11/1999 | Eberl et al. | |
| 5,992,429 A | 11/1999 | Peckman | |
| 5,998,305 A | 12/1999 | Holmer et al. | |
| 6,008,128 A | 12/1999 | Habuka et al. | |
| 6,024,045 A | 2/2000 | Kikuchi et al. | |
| 6,031,255 A | 2/2000 | Delage et al. | |
| 6,043,519 A | 3/2000 | Shealy et al. | |
| 6,049,098 A | 4/2000 | Sato | |
| 6,058,945 A | 5/2000 | Fujiyama et al. | |
| 6,060,397 A | 5/2000 | Seamons et al. | |
| 6,063,300 A | 5/2000 | Suzuki et al. | |
| 6,071,823 A | 6/2000 | Hung et al. | |
| 6,074,478 A | 6/2000 | Oguro | |
| 6,079,426 A | 6/2000 | Subrahmanyam et al. | |
| 6,100,184 A | 8/2000 | Zhao et al. | |
| 6,107,192 A | 8/2000 | Subrahmanyan et al. | |
| 6,110,289 A | 8/2000 | Moore | |
| 6,110,836 A | 8/2000 | Cohen et al. | |
| 6,140,226 A | 10/2000 | Grill et al. | |
| 6,153,529 A | 11/2000 | Agarwal | |
| 6,164,295 A | 12/2000 | Ui et al. | |
| 6,165,273 A | 12/2000 | Fayfield et al. | |
| 6,177,364 B1 | 1/2001 | Huang | |
| 6,190,453 B1 | 2/2001 | Boydston et al. | |
| 6,197,694 B1 | 3/2001 | Beinglass | |
| 6,204,120 B1 | 3/2001 | Gilboa et al. | |
| 6,211,092 B1 | 4/2001 | Tang et al. | |
| 6,221,168 B1 | 4/2001 | Carter et al. | |
| 6,284,050 B1 | 9/2001 | Shi et al. | |
| 6,294,466 B1 | 9/2001 | Chang | |
| 6,296,909 B1 | 10/2001 | Spitsberg et al. | |
| 6,313,042 B1 | 11/2001 | Cohen et al. | |
| 6,316,795 B1 | 11/2001 | Croke, III | |
| 6,319,861 B1 | 11/2001 | Shih et al. | |
| 6,329,297 B1 | 12/2001 | Balish et al. | |
| 6,339,028 B2 | 1/2002 | Tesauro | |
| 6,346,489 B1 | 2/2002 | Cohen et al. | |
| 6,347,636 B1 | 2/2002 | Xia et al. | |
| 6,348,125 B1 | 2/2002 | Geusic et al. | |
| 6,362,110 B1 * | 3/2002 | Marks ................ 438/711 |
| 6,372,657 B1 | 4/2002 | Hineman et al. | |
| 6,374,831 B1 | 4/2002 | Chandran et al. | |
| 6,391,796 B1 | 5/2002 | Akiyama et al. | |
| 6,395,192 B1 | 5/2002 | Nemirovsky et al. | |
| 6,454,854 B1 | 9/2002 | Ose | |
| 6,455,445 B2 | 9/2002 | Matsuki | |
| 6,457,478 B1 | 10/2002 | Danese | |
| 6,498,107 B1 | 12/2002 | Fenner | |
| 6,503,410 B1 | 1/2003 | Blalock et al. | |
| 6,534,412 B1 | 3/2003 | Lin | |
| 6,566,279 B2 | 5/2003 | Suemitsu et al. | |
| 6,593,211 B2 | 7/2003 | Sato | |
| 6,756,085 B2 | 6/2004 | Waldfried et al. | |
| 6,759,098 B2 | 7/2004 | Han et al. | |
| 6,815,332 B2 | 11/2004 | San et al. | |
| 6,881,683 B2 | 4/2005 | Matsuki et al. | |
| 7,108,748 B2 | 9/2006 | Brabant et al. | |
| 7,462,239 B2 | 12/2008 | Brabant et al. | |
| 2001/0032704 A1 | 10/2001 | Tesauro | |
| 2002/0106908 A1 | 8/2002 | Cohen et al. | |
| 2002/0108930 A1 | 8/2002 | Nemirovsky et al. | |
| 2002/0124867 A1 | 9/2002 | Kim et al. | |
| 2002/0151156 A1 | 10/2002 | Hallock et al. | |
| 2002/0189636 A1 * | 12/2002 | Sun ................ 134/1.1 |
| 2003/0036268 A1 | 2/2003 | Brabant et al. | |
| 2003/0060030 A1 | 3/2003 | Lee et al. | |
| 2004/0018319 A1 | 1/2004 | Waldfried et al. | |
| 2004/0023513 A1 * | 2/2004 | Aoyama et al. ............ 438/778 |
| 2004/0076767 A1 | 4/2004 | Satoh et al. | |
| 2004/0124420 A1 | 7/2004 | Lin et al. | |
| 2004/0161535 A1 | 8/2004 | Goundar et al. | |
| 2004/0248404 A1 | 12/2004 | Subrahmanyan et al. | |
| 2005/0009320 A1 | 1/2005 | Gundar | |
| 2005/0023478 A1 | 2/2005 | Ruckman et al. | |
| 2005/0085087 A1 | 4/2005 | Okigawa et al. | |
| 2005/0241670 A1 * | 11/2005 | Dong et al. ................ 134/1.1 |
| 2005/0241671 A1 * | 11/2005 | Dong et al. ................ 134/1.1 |
| 2005/0250346 A1 | 11/2005 | Schmitt et al. | |
| 2005/0274396 A1 * | 12/2005 | Shih et al. ................ 134/29 |
| 2006/0165904 A1 | 7/2006 | Ohara | |
| 2006/0196525 A1 * | 9/2006 | Vrtis et al. ................ 134/1 |
| 2006/0228473 A1 * | 10/2006 | Satoh et al. ............ 427/248.1 |

| | | | | | |
|---|---|---|---|---|---|
| 2008/0066778 A1* | 3/2008 | Matsushita et al. ........... 134/1.2 | JP | 1999-040506 | 2/1999 |
| 2008/0289650 A1 | 11/2008 | Arena | | | |
| 2009/0023229 A1* | 1/2009 | Matsushita et al. ............ 438/7 | | | |

FOREIGN PATENT DOCUMENTS

| | | |
|---|---|---|
| EP | 0291181 A2 | 11/1988 |
| EP | 1230989 A2 * | 8/2002 |
| JP | 1987-022420 | 1/1987 |
| JP | 1989-004015 | 1/1989 |
| JP | 1995-153685 | 6/1995 |

OTHER PUBLICATIONS

Wolf et al., Silicon Processing for the VLSI Era vol. 1: Process Technology, Lattice Press, Sunset Beach, CA, USA, pp. 140-143, 155-156, 1986.

Wolf et al., Silicon Processing for the VLSI Era vol. 1: Process Technology, Lattice Press, Sunset Beach, CA, USA, pp. 225-264, 2000.

* cited by examiner

METHOD OF CLEANING UV IRRADIATION CHAMBER

CROSS-REFERENCE TO RELATED APPLICATIONS

This application claims the benefit of U.S. Provisional Application No. 60/845,732, filed Sep. 19, 2006, the disclosure of which is herein incorporated by reference in its entirety.

BACKGROUND OF THE INVENTION

1. Field of the Invention

The present invention generally relates to semiconductor-processing by ultraviolet (UV) radiation and cleaning of a ultraviolet (UV) radiation chamber for semiconductor-processing, particularly cleaning of an optical transmitted window provided in a UV irradiation chamber.

2. Description of the Related Art

Traditionally, UV processing apparatuses have been used in general in the property modification of various processing targets by means of UV light as well as in the production of substances that utilize photochemical reaction. With the trend for higher integration of devices in recent years, wiring designs are becoming finer and multi-layer wiring structures are being adopted, which in turn is making it necessary to reduce inter-layer volumes in devices to achieve higher processing speeds and lower power consumptions. Low-k (low dielectric constant film) materials are used to reduce inter-layer volumes in devices. As the dielectric constant drops, however, mechanical strength (elastic modulus, or EM) also drops and the low-k material thus becomes less resistant to stress received in the subsequent processes such as CMP, wire bonding and packaging. One method to address the aforementioned problem is to cure the low-k material through UV irradiation to improve its mechanical strength (refer to U.S. Pat. Nos. 6,759,098 and 6,296,909 for examples). UV irradiation causes the low-k material to contract and harden, resulting in an improvement of mechanical strength by 50 to 200%.

Another requirement resulting from the recent trend of high-integration devices is to obtain various thin films using thermal CVD or PECVD in a condition free from heat or plasma damage. To meet this requirement, photo-CVD that utilizes photochemical reaction has been studied.

However, irradiating optical energy onto the processing target or reaction space by any of the aforementioned methods requires the UV lamp to be separated from the reaction space because: (1) the pressure in the reaction space must be controlled along with the ambient gas, (2) the generated gas can contaminate the UV lamp, and (3) the generated gas must be discharged safely. As a division plate used for this purpose, normally optical transmitted window made of synthetic quartz, a material that transmits optical energy, has been traditionally employed.

SUMMARY OF THE INVENTION

However, UV light that generates high energy tends to cause a drop in transmission factor depending on the material of the transmitted window and also due to deposits accumulating on the window material, and therefore the maintenance cycle (number of processings and processing time required before the transmitted window is cleaned or replaced) must be set very short in the cure process where a large amount of outgas (cracked gas generated by the irradiated film) generates.

Traditionally, the method of introducing $O_2$ to the reaction space and irradiating UV to generate ozone, thereby removing the deposits by means of the generated ozone, has been used in general. However, other methods offering higher efficiency are being sought in light of the longer cleaning time required in the cure process where a large amount of outgas generates.

In an embodiment of the present invention, $O_2$ is activated by a remote plasma unit or ozone generator and then the activated $O_2$ is introduced to the chamber to implement cleaning. In an embodiment, the aforementioned activated oxygen is irradiated with a UV lamp to accelerate activation for effective cleaning. In an embodiment, either of the aforementioned cleaning methods may be combined with the traditional ozone cleaning method using $O_2$ and UV light.

In another embodiment of the present invention, a more efficient cleaning method is implemented whereby, instead of $O_2$ used in the aforementioned methods or as an additive gas, a cleaning gas containing fluorine is activated by a remote plasma unit and then introduced into the chamber. In this case, in an embodiment a material offering a high transmission factor is selected for the transmitted window to prevent the window from corroding as a result of fluorine. Examples of such material include a crystal of $CaF_2$, $MgF_2$, $BaF_2$ or $Al_2O_3$, or a synthetic quartz coated with $CaF_2$, $MgF_2$, $BaF_2$ or $Al_2O_3$.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and not to scale.

DETAILED DESCRIPTION OF THE PREFERRED EMBODIMENT

The invention will be explained further with reference to specific embodiments, but the specific embodiments are not intended to limit the present invention.

In an embodiment, the present invention provides a method of cleaning a UV irradiation chamber comprising steps of: (i) after completion of irradiating a substrate with UV light transmitted through an optical transmitted window provided in the UV irradiation chamber, generating radical species of a cleaning gas outside the UV irradiation chamber; and (ii) introducing the radical species from the outside of the UV irradiation chamber into the UV irradiation chamber, thereby cleaning the optical transmitted window.

The UV irradiation process can be any suitable processes including those disclosed in U.S. Pat. Nos. 6,759,098 and 6,296,909, the disclosure of which is incorporated herein by reference in their entirety. Typically, the process may comprise processing a substrate (e.g., a semiconductor substrate) placed on a susceptor provided in a UV irradiation chamber, by irradiating the substrate with UV light through an optical transmitted window provided in the UV chamber between a UV light source and the susceptor.

In an embodiment, prior to the UV irradiation process, a film constituted by Si, C, H, O, and optionally N can be formed on the substrate by e.g., PECVD, PEALD, PVD, etc. In the above, the UV irradiation process is a curing process of the film. The UV irradiation process need not be limited to the curing process, and in an embodiment, the UV irradiation process is a light-CVD process.

The film includes, but is not limited to, a low dielectric film or a silicon carboxide film. When the film formed on the substrate is cured in the UV irradiation chamber, a significant amount of outgas is generated from the film as a result of decomposition of the chemical structures in the UV irradiation chamber. The outgas may be composed of hydrocarbon species. The outgas accumulates on a surface of the inner wall of the UV irradiation chamber including the optical transmitted window. The deposit of the accumulated outgas interferes with UV light transmission through the optical transmitted window, thereby decreasing efficiency of curing. Thus, particularly, the optical transmitted window needs to be cleaned frequently.

In an embodiment, radical species of a cleaning gas is generated by a method other than UV irradiation outside the UV irradiation chamber. By UV irradiation, radical species of a cleaning gas can be generated, but it is difficult to obtain a sufficient amount of radical species, although it depends on the wavelength of light and the intensity of light. For example, a high-pressure mercury lamp may generate ozone from oxygen on the order of several to several tens ppm. An Xe excimer laser may convert several percents of oxygen to ozone. In an embodiment, the radical species are generated in a remote plasma unit. If the cleaning gas is oxygen, an ozonizer or ozone generator may be used in place of the remote plasma unit. The externally excited species have higher energy and can more efficiently clean the optical transmitted window than the conventional UV irradiation.

In an embodiment, the radical species are introduced from the outside of the UV irradiation chamber into the UV irradiation chamber, thereby cleaning the optical transmitted window. The cleaning gas may be an oxygen gas. In an embodiment, by a remote plasma unit, as high percent of oxygen as about 80% can be converted to ozone. However, a life of ozone may be short and some of the radicals may not be maintained until the radicals reach the UV irradiation chamber. Thus, in a preferred embodiment, the radical species are further excited by irradiating the radical species with the UV light through the optical transmitted window.

When a remote plasma unit (e.g., ASTRON™ manufactured by MKS) is used for exciting an oxygen gas, by controlling the pressure and flow in the UV irradiation chamber, the cleaning process can be controlled. In an embodiment, the pressure may be 10 Torr or less (e.g., 1-7 Torr), a flow rate of oxygen gas may be 0.1-10 slm (e.g., 0.3-1 slm), a flow rate of inert gas such as Ar, He, Kr, or Xe may be 0.5-15 slm (e.g., 1-5 slm; greater than that of oxygen gas), and a cleaning time may be 5-1000 sec (e.g., 10-600 sec, 50-200 sec). Preferably, in the above, UV irradiation is combined where UV light has an intensity of 1 mW/cm2-500 mW/cm2 (e.g., 100 mW/cm2-400 mW/cm2) and a wavelength of 100-1000 nm (e.g., 200-400 nm).

In an embodiment, the cleaning gas may be a gas containing fluorine in a molecule such as $NF_3$, $C_2F_6$, and $C_3F_8$. The gas containing fluorine has high energy and can efficiently clean the optical transmitted window. However, on the other hand, the gas containing fluorine may damage the optical transmitted window by corroding its surface. Normally, the optical transmitted window is made of synthetic glass (silicon oxide), and the synthetic glass is apt to be etched by fluorine-containing gas. In a preferred embodiment, the optical transmitted window may be constituted by a material which is resistant to fluorine-containing gas. In an embodiment, the optical transmitted window may be constituted by a crystal of $CaF_2$, $MgF_2$, $BaF_2$, or $Al_2O_3$. In another embodiment, the optical transmitted window may be constituted by a synthetic quartz coated with $CaF_2$, $MgF_2$, $BaF_2$, or $Al_2O_3$. $CaF_2$, for example, has a higher optical transmission factor than $SiO_2$ and thus is preferred.

When a fluorine-containing gas is used as the cleaning gas, although additional UV irradiation can be performed but need not be performed in the UV irradiation chamber in an embodiment. In an embodiment, the cleaning conditions may as follows: The pressure may be 10 Torr or less (e.g., 1-7 Torr), a flow rate of fluorine-containing gas (e.g., $NF_3$) may be 0.1-5 slm (e.g., 0.5-1.5 slm), a flow rate of inert gas such as Ar, He, Kr, or Xe may be 1-15 slm (e.g., 1-5 slmgreater than that of fluorine-containing gas), and a cleaning time may be 5-1000 sec (e.g., 10-600 sec, 50-200 sec).

In the above, as the cleaning gas, oxygen gas and fluorine-containing gas can be used in combination.

In an embodiment, the optical transmitted window may have a diameter of 110% to 150% of that of a substrate (e.g., 120% to 130%) (e.g., 360 mm to 380 mm for a substrate having a diameter of 300 mm), and have a thickness of 10 mm to 30 mm (e.g., about 20 mm) which is sufficient to be used in a vacuum. In an embodiment, a distance between the optical transmitted window and the substrate may be 5 mm to 30 mm (e.g., 10 mm to 20 mm).

In an embodiment, the present invention provides a method of semiconductor-processing by UV irradiation and cleaning a UV irradiation chamber for semiconductor-processing, comprising the steps of: (i) processing a semiconductor substrate placed on a susceptor provided in a UV irradiation chamber, by irradiating the substrate with UV light through an optical transmitted window provided in the UV chamber between a UV light source and the susceptor; and (ii) after completion of the processing step, introducing radical species of a cleaning gas from the outside of the UV irradiation chamber into a space defined between the optical transmitted window and the susceptor, thereby cleaning the optical transmitted window. In the processing step, the UV light may have a wavelength of 200 nm to 500 nm (e.g., 100 nm to 400 nm).

The present invention will be explained with reference to drawings and preferred embodiments which are not intended to limit the present invention.

In the present disclosure where conditions and/or structures are not specified, the skilled artisan in the art can readily provide such conditions and/or structures, in view of the present disclosure, as a matter of routine experimentation.

Figure 1:
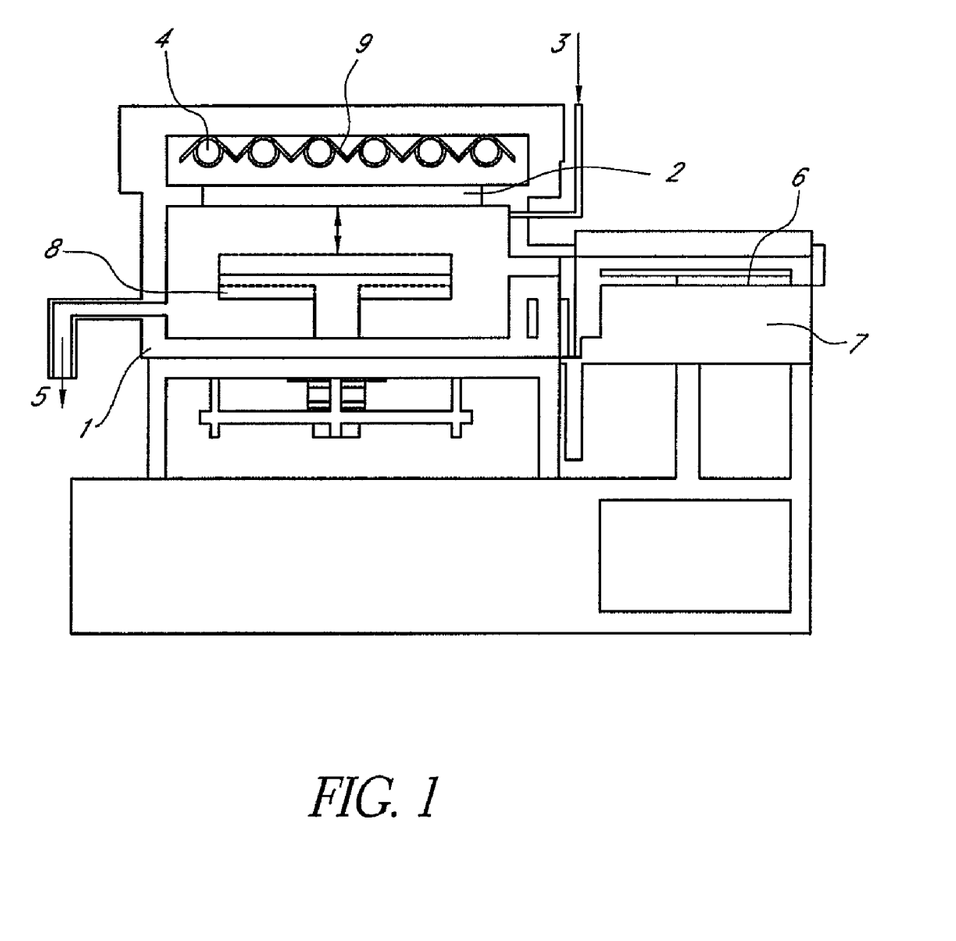
FIG. 1 is a schematic diagram showing a UV irradiation apparatus useable in an embodiment of the present invention.

FIG. 1 is a schematic diagram showing a UV irradiation apparatus useable in an embodiment of the present invention. This apparatus comprises a chamber that can be controlled to a range of pressure conditions from vacuum to near atmospheric pressure, and a UV irradiation unit installed above the chamber. To be specific, this apparatus comprises a UV lamp 4, an irradiation window 2, a gas introduction port 3, a UV irradiation chamber 1, a heater table 8, an exhaust port 5 connected to a vacuum pump, and a load lock chamber 7 having a LL arm 6 and connected to the UV irradiation chamber. It should be noted, however, that the apparatus need not conform to this figure as long as UV irradiation can be implemented.

This UV irradiation apparatus has the UV emitter 4 that emits UV light continuously or in pulses, the heater 8 installed in parallel with and facing the aforementioned emitter, and the irradiation window glass 2 installed in parallel with and facing the UV emitter 4 and heater 8 at a position between the two. The irradiation window 2 is used to achieve uniform UV irradiation by shielding the reactor from atmosphere while transmitting UV light. As for the UV emitter 4 in the UV irradiation unit, multiple tubular emitters may be placed in parallel with one another, with the layout of these emitters arranged properly so as to achieve uniform illuminance, as shown in FIG. 1. A reflector 9 is provided to cause the UV light from each UV emitter to properly reflect onto the thin film (the reflector resembles an umbrella placed over the UV lamp), and the angle of the reflector 9 is made adjustable to achieve uniform illuminance.

Figure 2A:
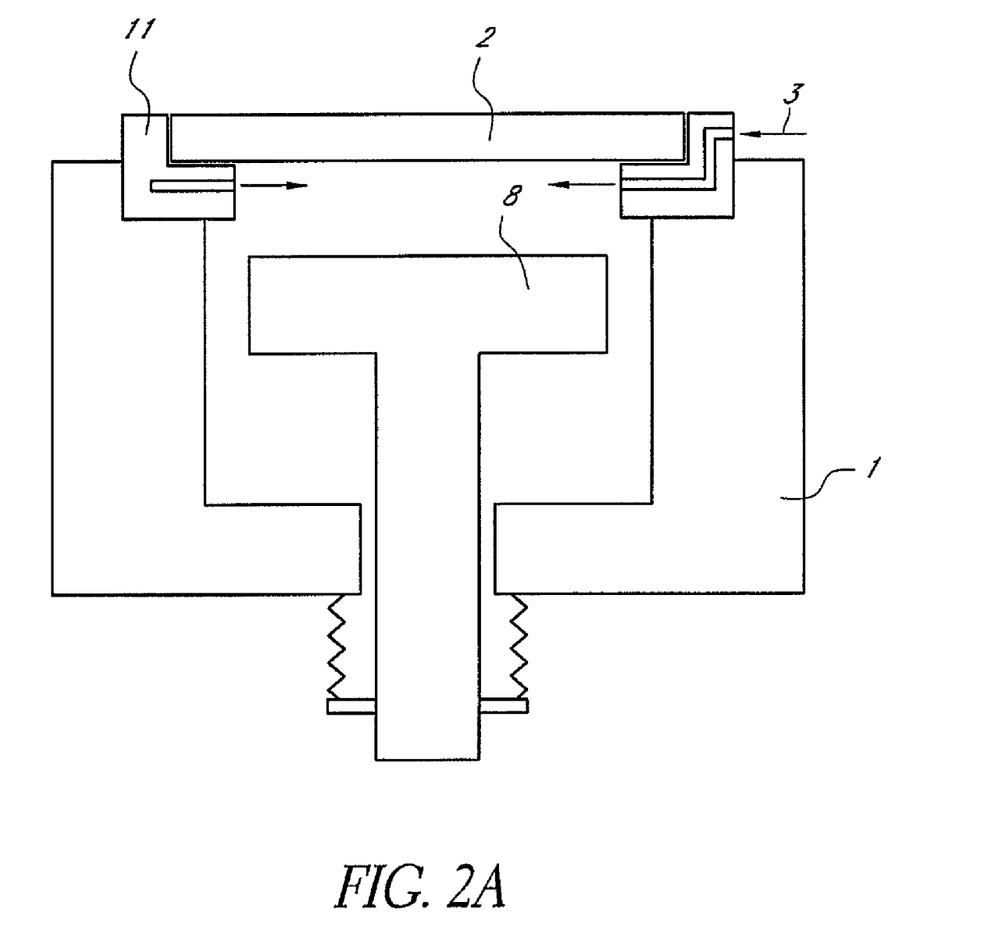
FIG. 2(a) is a schematic diagram showing a UV irradiation chamber usable in an embodiment of the present invention.
Figure 2B:
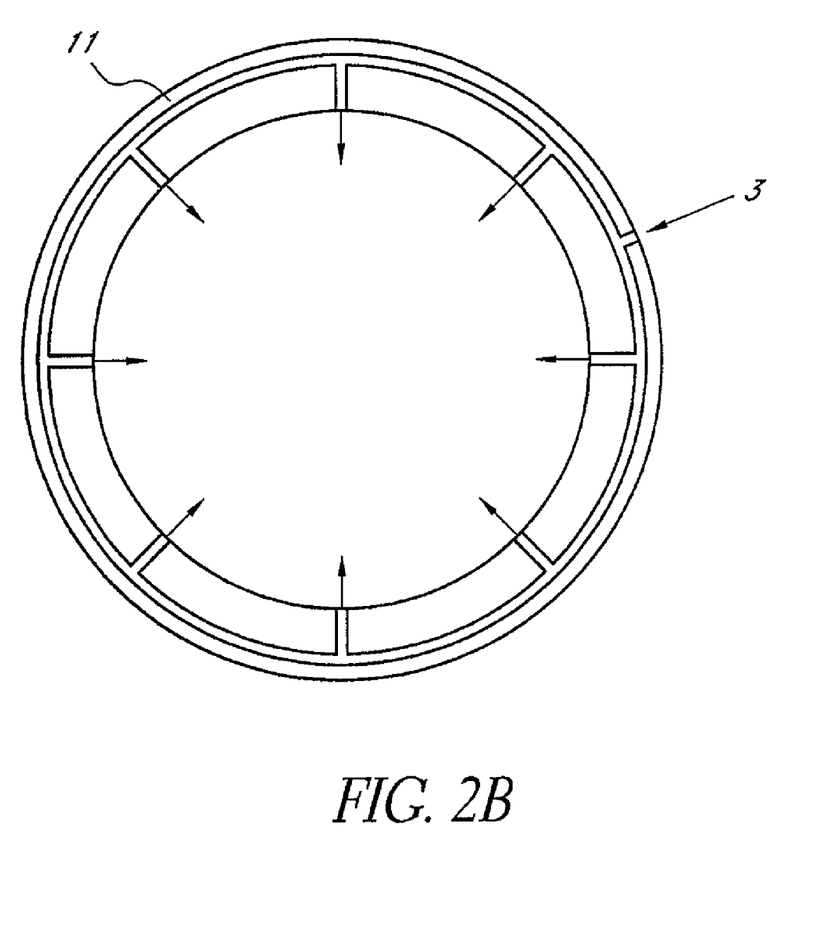
FIG. 2(b) is a schematic diagram showing a top view of the UV irradiation chamber shown in FIG. 2(a).

As shown in the schematic diagrams in FIGS. 2(a) and 2(b), this apparatus has a flange 11 in which the irradiation window glass 2 is set, so as to separate the substrate processing part in the chamber 1 that can be controlled to a range of pressure conditions from vacuum to near atmospheric pressure, from the UV emission part that stores the UV emitters 4 emitting UV light continuously or in pulses. This flange 11 is connected to the gas introduction port 3 and multiple gas discharge ports are provided in circumferential direction at specified intervals so that gas is discharged uniformly from points along the circumference toward the interior. To be specific, gas is introduced through the flange 11 and the multiple gas introduction ports are arranged symmetrically to create a uniform processing ambience. The UV emitter 4 is structured in such a way that it can be easily removed and replaced.

Figure 4:
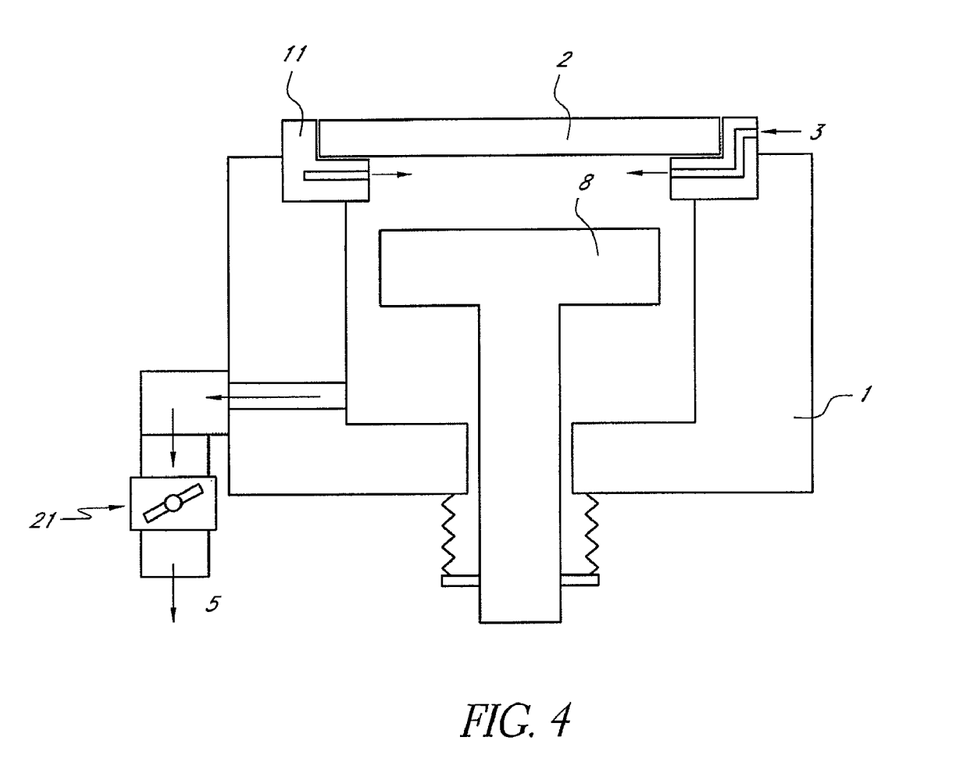
FIG. 4 is a schematic diagram showing a UV irradiation chamber usable in an embodiment of the present invention.

As shown in the schematic diagram in FIG. 4, the pressure in the substrate processing part is adjusted by a pressure control valve 21 provided at the exhaust port 5. While the UV Osion part is also a sealed space, it has an introduction port and discharge port (not illustrated) for purge gas (constantly purged by atmosphere, $N_2$, etc.).

Examples of the UV irradiation process are shown below. It should be noted, however, that the present invention is not at all limited to these embodiments. First, a gas selected from Ar, CO, $CO_2$, $C_2H_4$, $CH_4$, $H_2$, He, Kr, Ne, $N_2$, $O_2$, Xe, alcohol gases and organic gases is introduced to the chamber 1 to create an ambience with a pressure between approx. 0.1 Torr and near atmosphere (including 1 Torr, 10 Torr, 50 Torr, 100 Torr, 1,000 Torr and any values between the foregoing numbers), and next a semiconductor substrate, which is the processing target, is transferred from the load lock chamber 7 via the gate valve and placed on the heater 8 that has been set to a temperature between approx. 0° C. and approx. 650° C. (including 10° C., 500° C., 100° C., 200° C., 300° C., 400° C., 500° C., 600° C. and any values between the foregoing numbers, but preferably between 300° C. and 450° C.), after which UV light with a wavelength between approx. 100 nm and approx. 400 nm (including 150 nm, 200 nm, 250 nm, 300 nm, 350 nm and any values between the foregoing numbers, but preferably approx. 200 nm) and output between 1 $mW/cm^2$ and approx. 1,000 $mW/cm^2$ (including 10 $mW/cm^2$, 50 $mW/cm^2$, 100 $mW/cm^2$, 200 $mW/cm^2$, 500 $mW/cm^2$, 800 $mW/cm^2$ and any values between the foregoing numbers) is irradiated at an appropriate distance (gap) (between 1 cm and 100 cm) from the UV emitters 4, onto the thin film on the semiconductor substrate either continuously or in pulses at a frequency between approx. 1 Hz and approx. 1,000 Hz (including 10 Hz, 100 Hz, 200 Hz, 500 Hz and any values between the foregoing numbers). The irradiation time is between approx. 1 sec and approx. 20 min (including 5 sec, 10 sec, 20 sec, 50 sec, 100 sec, 200 sec, 500 sec, 1,000 sec and any values between the foregoing numbers). The gas in the chamber 1 is discharged from the exhaust port 5.

This semiconductor manufacturing apparatus carries out the above series of processing steps according to an automatic sequence, where the processing steps implemented include introduction of gas, irradiation of UV light, stopping of irradiation, and stopping of gas.

When outgas is generated from the thin film on the semiconductor substrate as a result of UV irradiation, substances constituting the outgas deposit on the irradiation window glass made of synthetic quartz or the like, and also on the interior walls of the chamber. The contaminants deposited on the irradiation window absorb UV light and decrease the cure efficiency. The contaminants deposited on the interior walls of the chamber can produce particles as they are separated from the walls.

Figure 3:
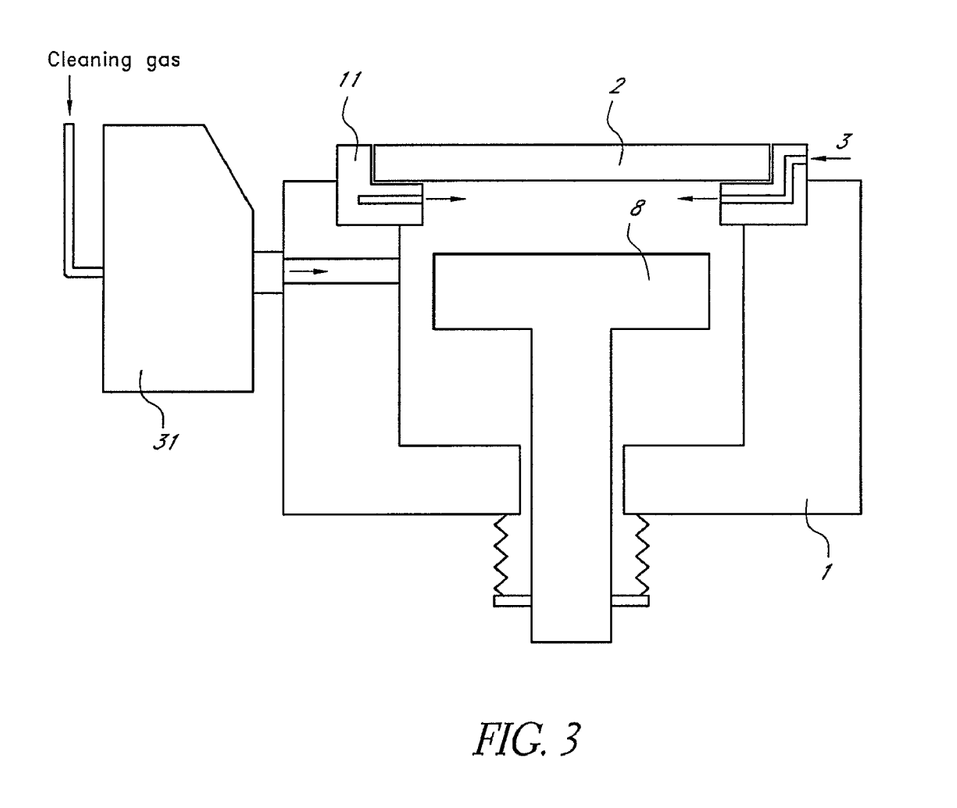
FIG. 3 is a schematic diagram showing a UV irradiation chamber where a remote plasma unit is attached usable in an embodiment of the present invention.

Cleaning is performed to remove these contaminants. For example, cleaning is implemented by causing ozonization of $O_2$ using UV light and removing the contaminants by causing them to react with ozone. Since the percentage of $O_2$ ozonized by UV light is very low, in an embodiment of the present invention $O_2$ is converted to radicals using a remote plasma unit before being introduced to the chamber, and the resulting $O_2$ radicals are then ozonized by UV light to increase the ozone production efficiency. FIG. 3 shows a schematic diagram of a condition where a remote plasma unit 31 is connected to the UV chamber 1. Cleaning gas is introduced to the remote plasma unit 31, where it is excited and subsequently introduced to the UV chamber 1.

On the other hand, in cases where using ozone alone may not achieve sufficient cleaning when the film to be cured generates deposits that cannot be broken down by ozone or a large amount of deposits, $NF_3$ can be used as the cleaning gas in an embodiment of the present invention. To be specific, $NF_3$ is introduced to the remote plasma unit (refer to FIG. 3) where it is broken down to generate fluorine radicals, after which the generated fluorine radicals are introduced to the chamber to break down and remove the contaminants on the irradiation window and interior chamber walls.

However, these fluorine radicals, although having the effect of breaking down and removing the contaminants in the reactor, also cause the adverse effect of eroding the surface of the irradiation window made of synthetic quartz and thereby reducing the UV transmission factor.

Figure 5:
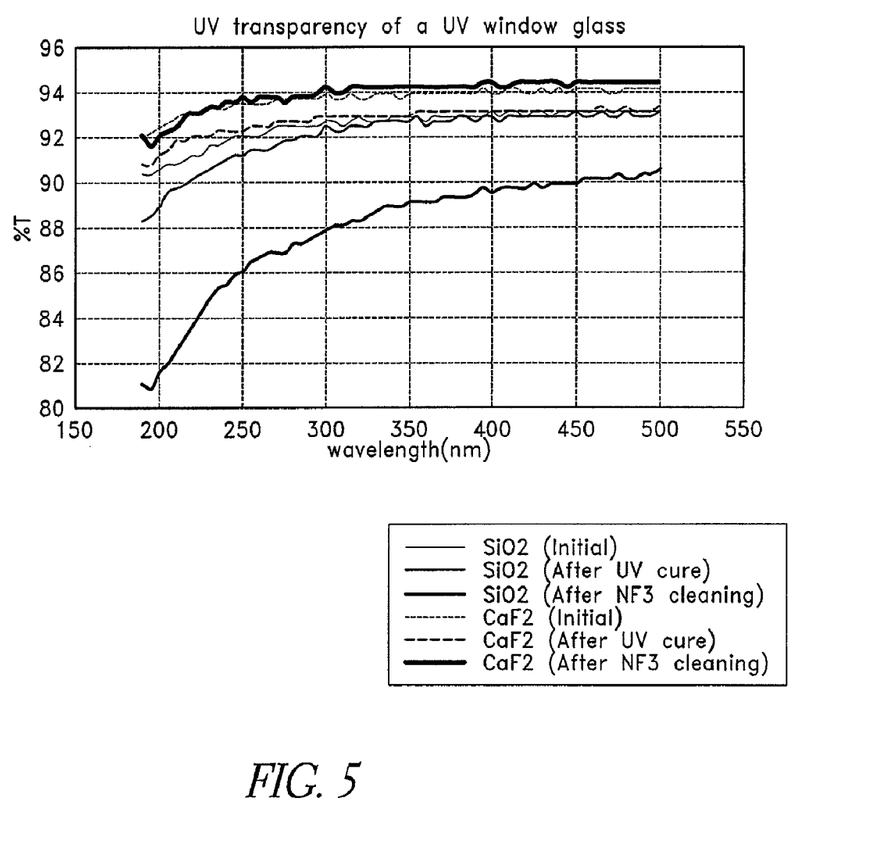
FIG. 5 is a graph showing relationships between UV transmission factor (%) and wavelength (nm) in examples.

FIG. 5 shows the result of measurement using a spectrophotometer, showing how much of light of which wavelength is transmitted by the irradiation window glass (thickness: 20 mm). Measurement was performed with a synthetic quartz ($SiO_2$) glass and a $CaF_2$ glass. In FIG. 5, first the UV transmission factor (%) of the irradiation glass was measured, and then a substrate (300 mm) on which a low-k film (SiCOH film) had been formed was transferred into the UV chamber and cured under the following conditions:

Pressure: 1 to 100 Torr, Introduced gas: $N_2$, Temperature: 300 to 450° C., Distance between substrate and irradiation window: 0.1 to 10 cm, UV wavelength: 100 to 400 nm, Output: 5 to 400 mW/cm$^2$, Irradiation time: 60 to 600 sec.

After the low-k film was cured by UV light under the above conditions, the UV transmission factor (%) of the irradiation window glass was measured again. (Was UV irradiation performed only once or multiple times?)

Next, the interior of the UV chamber was cleaned. The cleaning conditions were as follows:

Remote plasma unit: ASTRON™, Cleaning gas: $NF_3$, Chamber pressure: 1 to 10 Torr, Flow rate of cleaning gas: 0.5 to 2 slm, Flow rate of Ar gas: 2 to 5 slm, Cleaning time: 1 min.

After the cleaning, the UV transmission factor (%) of the irradiation window glass was measured again.

As a result, it was found that, although synthetic quartz ($SiO_2$) transmitted 90% or more of UV light with a wavelength of 200 nm or more in the initial condition, once the low-k film was cured by UV light the transmission factor dropped by approx. 1 to 2% for light with a wavelength of 300 nm or less, as shown in FIG. 5. After $NF_3$ cleaning was carried out for 1 minute using the remote plasma unit, the transmission factor dropped considerably and the extent of drop was as much as 10% with light with a wavelength of 200 nm. Whitening and roughening of the glass surface was also visually observed.

On the other hand, the experiment carried out using a $CaF_2$ glass window in a manner similar to the $SiO_2$ experiment revealed that, when the irradiation window was made of $CaF_2$ resistant to fluorine, fluorine erosion was prevented and the effect of radical cleaning using $NF_3$ improved, as shown in FIG. 5. In this experiment, $CaF_2$ was used in light of its resistance to fluorine. $CaF_2$ is also favored in that its overall transmission factor is higher than that of $SiO_2$. To be specific, the transmission factor was between 92% and 94% in the initial condition, which then dropped by approx. 1% after the curing of the low-k film. After 1 minute of $NF_3$ cleaning using the remote plasma unit, however, the transmission factor recovered to the initial level (although the transmission factor measured after the cleaning was higher than the level in the initial condition, this is probably due to a measurement error or caused by the cleaning, of contaminants that were already deposited in the initial condition). No whitening or roughening was visually observed. This confirms sufficient fluorine resistance of the $CaF_2$ glass.

As explained above, in an embodiment of the present invention the cleaning speed of the UV chamber can be increased dramatically by cleaning the UV irradiation window using a remote plasma unit, or by using an irradiation window resistant to fluorine and then cleaning the window using a fluorine cleaning gas offering high cleaning performance.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of semiconductor-processing by UV irradiation and cleaning a UV irradiation chamber for semiconductor-processing, the method comprising:

processing a semiconductor substrate placed on a susceptor provided in a UV irradiation chamber, by irradiating the substrate with an energy source consisting of UV light through an optical transmitted window provided in the UV irradiation chamber between the UV light and the susceptor while introducing gas through multiple ports from a vicinity of an outer periphery of the optical transmitted window towards a center of the optical transmitted window, wherein the multiple ports are arranged symmetrically to direct said gas in a radial direction towards the optical transmitted window; and after completion of the processing step, introducing cleaning radicals consisting of radicals generated from $O_2$ gas from only a remote plasma unit outside of the UV irradiation chamber into a space defined between the optical transmitted window and the susceptor, wherein the cleaning radicals are ozonized by said UV light in the space, thereby increasing ozone production, wherein the ozone cleans the optical transmitted window, wherein the cleaning radicals are introduced into the UV irradiation chamber through a side wall of the UV irradiation chamber along a straight line extending from the remote plasma unit into the space of the UV irradiation chamber.

2. The method according to claim 1, wherein the UV light has a wavelength of 200 nm to 500 nm.

3. The method according to claim 1, wherein in the processing step, a dielectric film or a silicon carboxide film is formed on the substrate.

4. The method according to claim 1, wherein in the processing step, the substrate is irradiated through the optical transmitted window constituted by a crystal of $CaF_2$, $MgF_2$, $BaF_2$, or $Al_2O_3$.

5. The method according to claim 1, wherein in the processing step, the substrate is irradiated through the optical transmitted window constituted by a synthetic quartz coated with $CaF_2$, $MgF_2$, $BaF_2$, or $Al_2O_3$.

6. The method according to claim 1, further comprising supplying $O_2$ gas and an inert gas to the remote plasma unit.

7. The method according to claim 6, wherein the inert gas comprises one or more selected from the group consisting of Ar, He, Kr, and Xe.

* * * * *